United States Patent [19]

Ogura et al.

[11] Patent Number: 5,159,427
[45] Date of Patent: Oct. 27, 1992

[54] SEMICONDUCTOR SUBSTRATE STRUCTURE FOR USE IN POWER IC DEVICE

[75] Inventors: Tsuneo Ogura, Yokohama; Akio Nakagawa, Hiratsuka, both of Japan

[73] Assignee: Kabushiki Kaisha Toshiba, Kawasaki, Japan

[21] Appl. No.: 588,544

[22] Filed: Sep. 26, 1990

[30] Foreign Application Priority Data

Sep. 29, 1989 [JP] Japan .................................. 1-254942
Dec. 28, 1989 [JP] Japan .................................. 1-344316

[51] Int. Cl.$^5$ ............................................. H01L 27/04
[52] U.S. Cl. ...................................... 357/48; 357/52; 357/20; 357/43
[58] Field of Search ...................... 357/48, 86, 40, 52

[56] References Cited

U.S. PATENT DOCUMENTS

| 4,641,171 | 2/1987 | Bertotti et al. ........................ 357/48 |
| 4,879,584 | 11/1989 | Takagi et al. ..................... 357/48 X |
| 4,979,008 | 12/1990 | Siligoni et al. ......................... 357/48 |

FOREIGN PATENT DOCUMENTS

| 0117867 | 9/1984 | European Pat. Off. . |
| 0156964 | 10/1985 | European Pat. Off. . |
| 2154786 | 11/1973 | France . |
| 2309040 | 11/1976 | France . |
| 2175138 | 11/1986 | United Kingdom . |

OTHER PUBLICATIONS

IEDM 1984, San Francisco, Dec. 9–12, 1984, pp. 698–701, T. Okabe et al "180V Analog-Compatible High-Speed Logic Utilizing Semi-Well Isolation Technology".

L'Onde Electrique, vol. 67, No. 6, Nov. 1987, pp. 58–69, Paris, FR; P. Rossel: "M.O.S. Technologies for Smart Power and High-Voltage Circuits".

Proceedings of the IRE, 49, 1920, "Electrical Characteristics of a Penning Discharge", J. C. Helmer and R. L. Jepsen, 1961.

Journal of Applied Physics, 33, 2093, "Mechanism of the Penning Discharge at Low Pressures", W. Knauer, Jun. 1962.

Journal of Vacuum Science and Technology A, 6, 2451, "Characteristics of Penning Ionization Guage Type Compact Microwave Metal Ion Source", Y. Yoshida, T. Ohnishi and Y. Hirofuji, Jul./ Aug. 1988.

Primary Examiner—Rolf Hille
Assistant Examiner—Roy Potter
Attorney, Agent, or Firm—Oblon, Spivak, McClelland, Maier & Neustadt

[57] ABSTRACT

A wafer substrate structure has a P type epitaxial wafer layer. An N+ type region separation layer is formed on the wafer layer to define a first closed region and a second region neighboring thereto. Formed in the first region are a P− type layer and an N− type layer stacked thereon and serving as a high-resistance layer for forming the first element. An N− type layer serving as a high-resistance layer exists in the second region of the wafer layer. These high-resistance layers are defined by separating a single semiconductor layer by an N+ type diffused separation layer. Forming a high-voltage transistor as a power element in the first region to be PN junction-separated brings a "double PN junction separation" structure wherein the first region is electrically separated by a PN junction from the second region and the high-voltage transistor is also PN junction-separated in the first region.

8 Claims, 17 Drawing Sheets

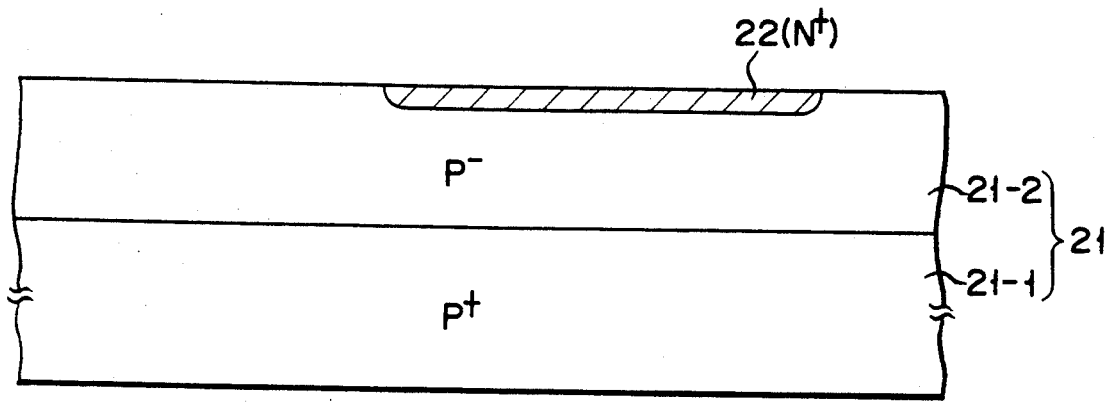
F I G. 8A
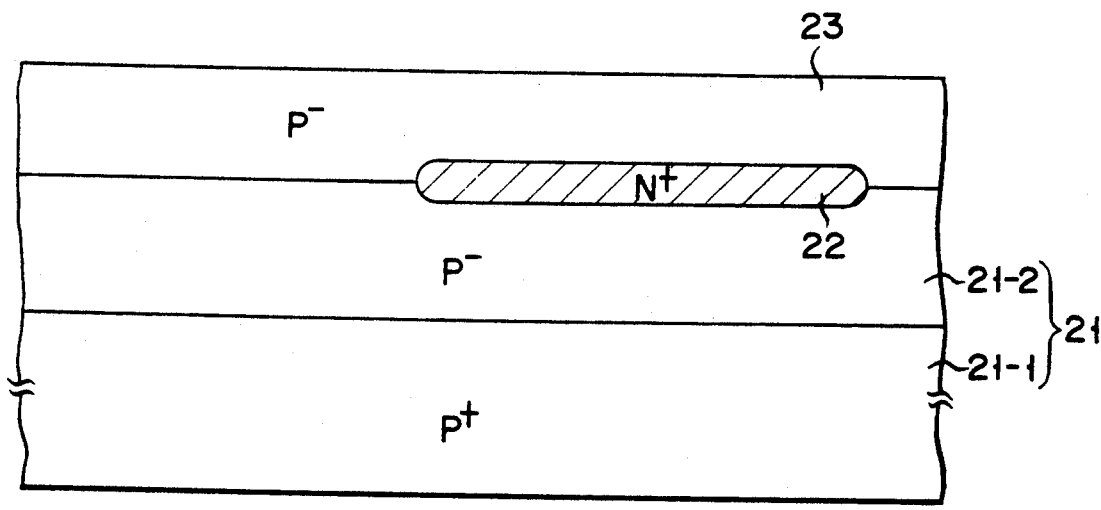
F I G. 8B

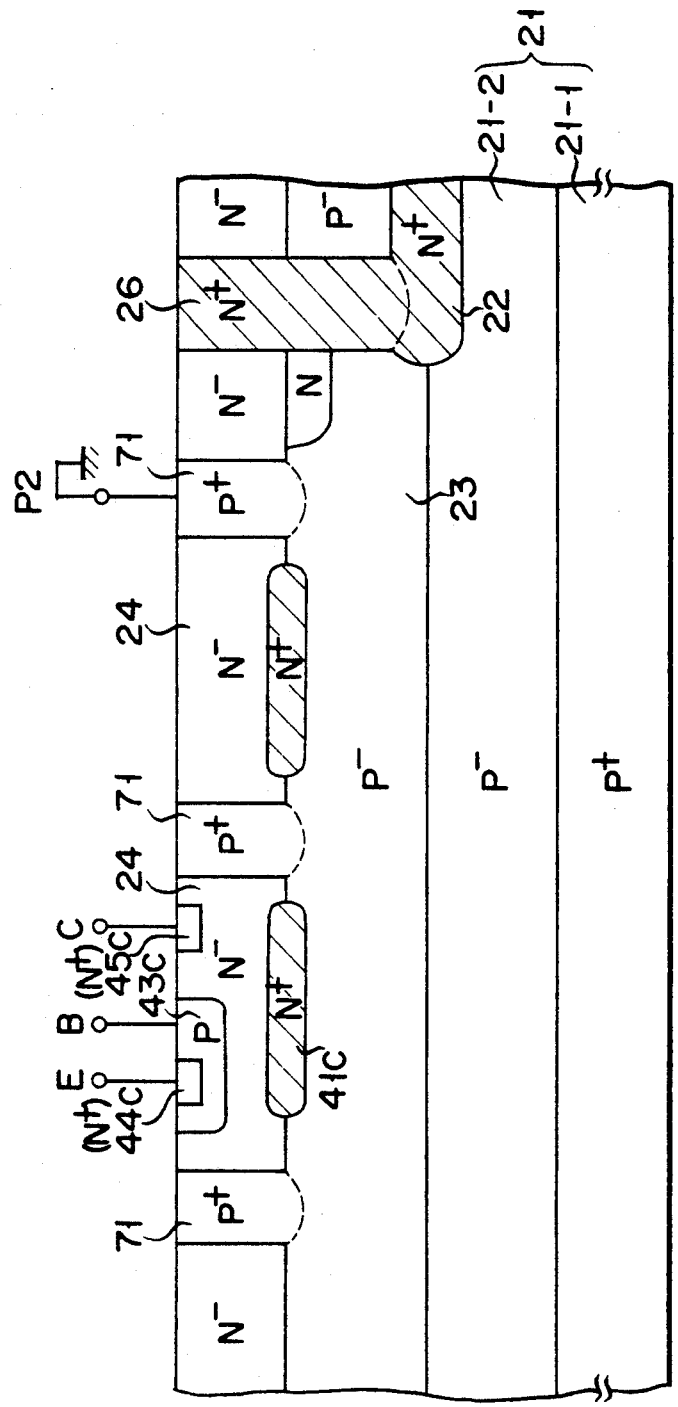
F I G. 9B

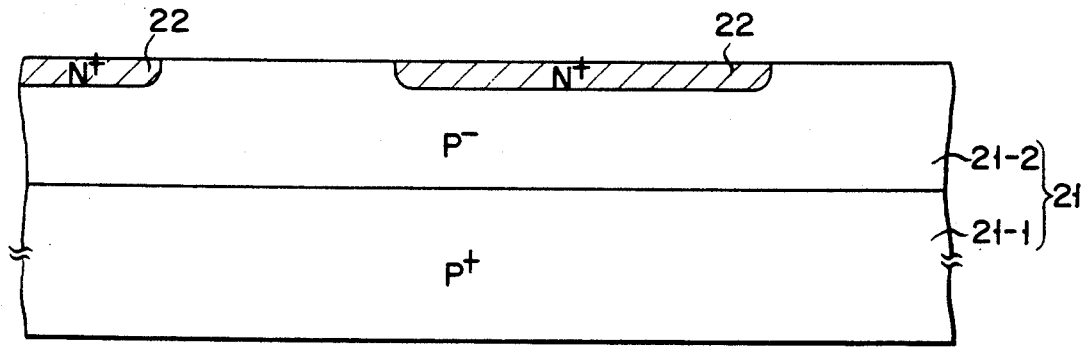
F I G. 11A
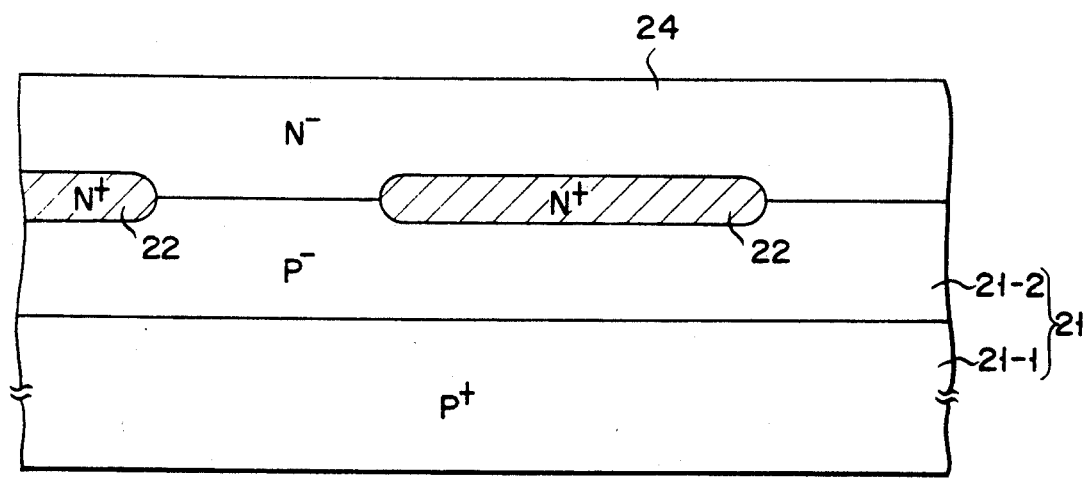
F I G. 11B

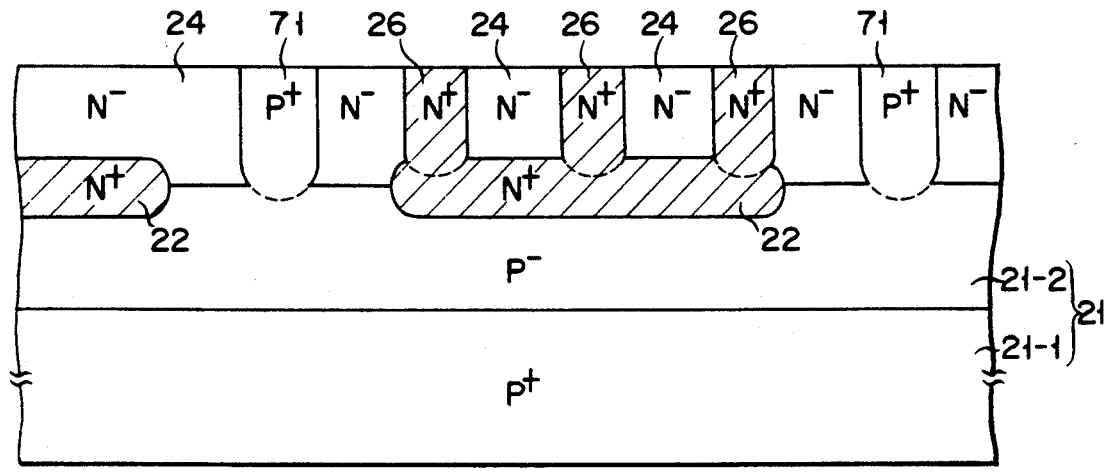
F I G. 11C
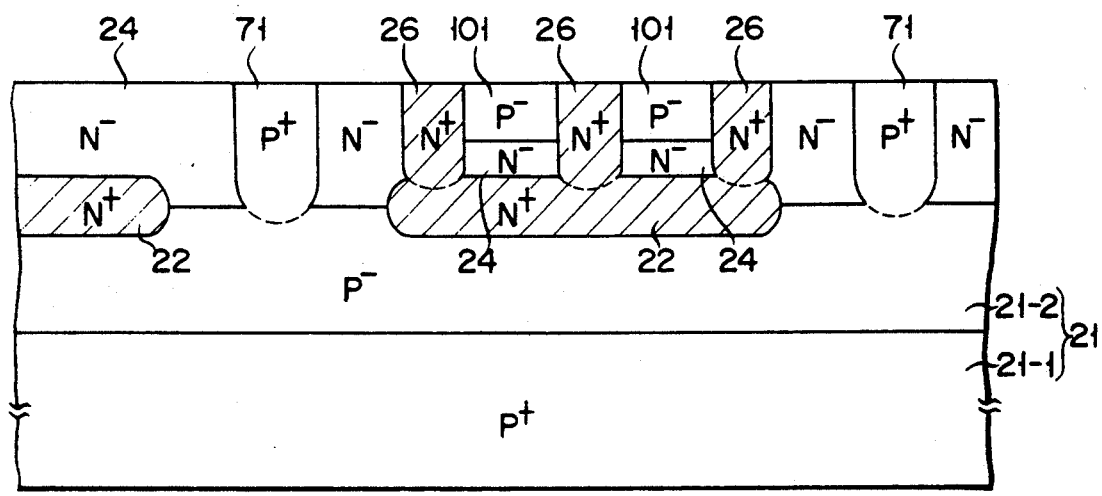
F I G. 11D

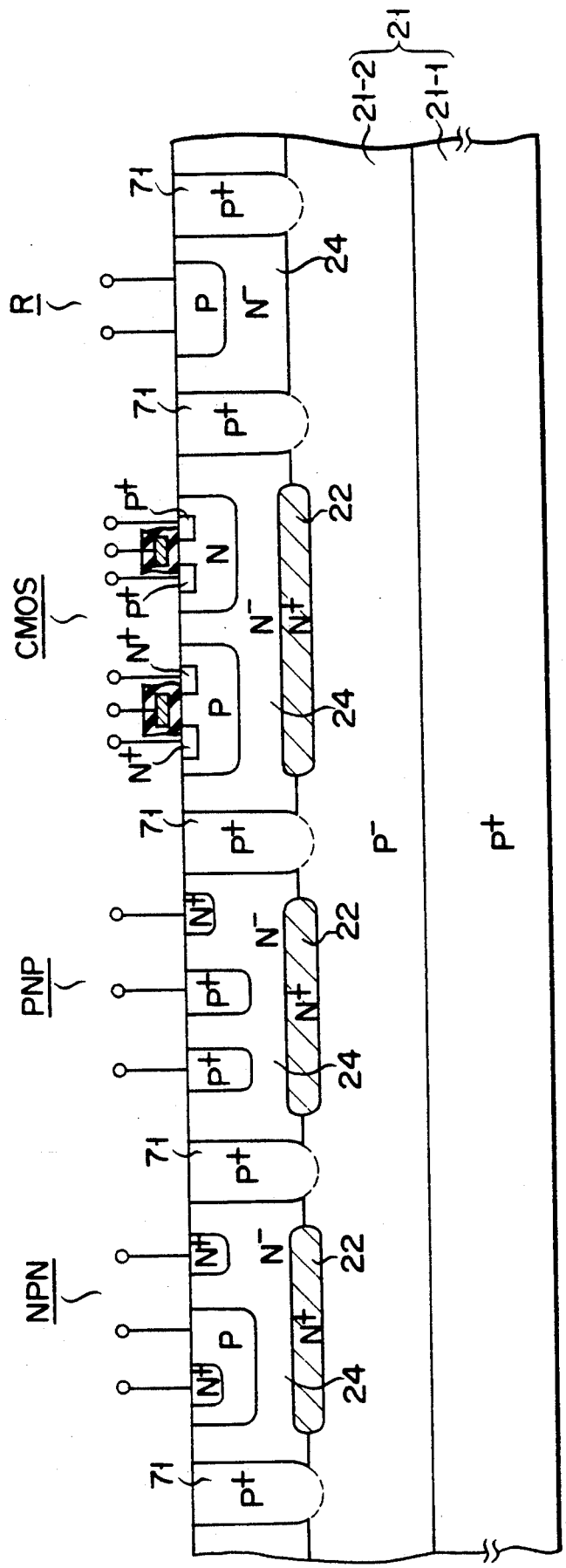
F I G. 13

SEMICONDUCTOR SUBSTRATE STRUCTURE FOR USE IN POWER IC DEVICE

BACKGROUND OF THE INVENTION

1. Field of the Invention

The present invention relates to semiconductor devices and, more particularly, to a semiconductor wafer suitable for integration of a circuit arrangement for power IC devices which include high-voltage transistors.

2. Description of the Related Art

Power semiconductor devices, such as bipolar transistors and metal-oxide semiconductor field effect transistors (MOSFETs), are generally connected in series with each other in an inverter circuit or the like. In such a circuit, diodes are often connected in parallel with series-connected transistors, respectively. In fact, many semiconductor IC manufacturers have produced circuit modules in which transistors connected in series with each other in this manner and diodes connected in parallel therewith are packaged into a single chip.

One circuit using such circuit modules is a three-phase inverter circuit, which includes the above-mentioned series-transistor/parallel diode circuit module and gate circuits for driving and controlling the module. Typically, such an inverter circuit includes three sets of series-circuits of transistors, each set consisting of a couple of bipolar transistors that are connected in series with each other. Six diodes are respectively connected in parallel with these bipolar transistors. Each of these transistors is provided with a gate circuit for driving it. The three sets of transistor circuits have two common connection terminals, one of which serves as a power supply voltage terminal, and the other of which acts as a ground terminal.

With such an arrangement, when the six gate circuits are to be integrated together onto one chip, optimal region separation cannot be performed due to the differences in the electrical operating environment among different gate circuit modules on the same wafer substrate. This problem is a serious factor which delays realizing IC packaging of high-voltage circuits for power semiconductor devices, which have been strongly demanded for a long time. The differences in the electrical operating environment may be caused in a case wherein a certain one of the gate circuits having the same element structure is constantly biased by a higher voltage, or a case wherein the reference voltage to a specific one of the gate circuits greatly varies within the range of a power source voltage to a ground potential depending on the operating states of another adjacent circuit.

Presently available dielectric isolation techniques may be used to perform the "individual independence region separation" on the same wafer substrate, i.e., in order to electrically separate a certain gate circuit module region from the remaining ones so as to allow it to operate independently of the operating states of the remaining ones. However, a wafer substrate having the dielectric separation structure suffers from several drawbacks, i.e., a complicated manufacturing process, limited integration, and high cost. These drawbacks make semiconductor manufacturers hesitate to apply the dielectric separation structure to the integration of high-voltage transistors and peripheral circuits If different operating environments of the respective gate circuits are compensated by techniques in circuit design, an overall circuit arrangement is undesirably complicated.

SUMMARY OF THE INVENTION

It is therefore an object of the present invention to provide a new and improved technique for separating elements-formation regions of a semiconductor wafer.

It is another object of the invention to provide a new and improved semiconductor wafer structure which is excellent in element separation characteristics and hence can be suitably applied to power semiconductor ICs.

In accordance with the above objects, the present invention is addressed to a specific substrate structure which includes a semiconductive substrate having a PN junction layer, and a closed region formed on the substrate and separated from other portions of the substrate by PN junction-separation. The closed region has a PN junction layer which is structurally equivalent to that of the substrate. The closed region serves as an elements-formation region allowing the formation of a semiconductor active element such as a high-voltage transistor which is subjected to PN junction-separation therein. With such a "double PN junction separation" structure, the above objects can be achieved. The "double PN junction separation" structure can be satisfactorily manufactured by using a presently available manufacturing process.

The invention and its objects and advantages will become more apparent in the detailed description of the preferred embodiments presented below.

BRIEF DESCRIPTION OF THE DRAWINGS

In the detailed description of preferred embodiments of the present invention presented below, reference is made to the accompanying drawings of which:

FIGS. 8A to 8E are diagrams schematically showing sectional structures obtained in main steps of a manufacturing process for the wafer in FIG. 7;

FIGS. 9A and 9B are diagrams showing a sectional structure of IC devices obtained by integrally forming a plurality of transistors in element-formation regions of the epitaxial wafer in FIG. 7;

FIGS. 11A to 11D are diagrams schematically showing sectional structures obtained in main steps of a manufacturing process for the wafer in FIG. 10;

FIG. 13 is a diagram showing a sectional structure of another sample of an IC structure to which the wafer in FIG. 10 is employed.

DETAILED DESCRIPTION OF THE PREFERRED EMBODIMENTS

Figure 1:
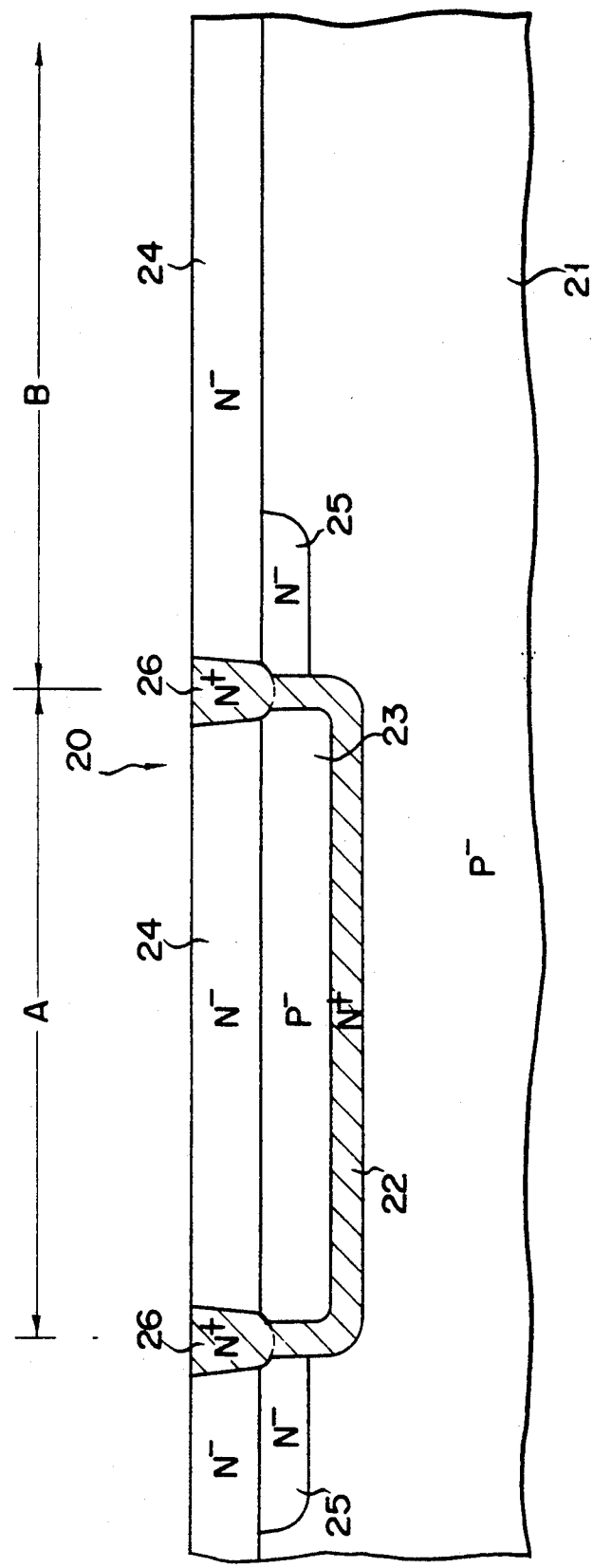
FIG. 1 is a diagram schematically showing a sectional structure in a main part of an epitaxial semiconductor wafer according to a preferred embodiment of the present invention.

Referring now to FIG. 1, an epitaxial semiconductor wafer in accordance with one preferred embodiment of this invention is designated generally by reference numeral "20." The semiconductor wafer 20 has a lightly-doped P conductivity type (to be refereed to as a "P−" type" hereinafter) silicon substrate 21. The substrate 21 has a first region A in which a plurality of elements electrically separated from each other by PN junction-separation are to be formed, and a second region B positioned outside the region A. The second region B is also a region in which a plurality of elements electrically separated from each other by PN junction-separation are to be formed.

In the first region A, a heavily-doped N type (N+ type) buried layer 22 is formed by diffusion in the P− type substrate 21. A P− type semiconductor layer 23 is formed by epitaxial growth on the N+ type diffusion layer 22. This epitaxial layer 23 has substantially the same order of impurity concentration as that of the substrate 21. A lightly-doped N type (N− type) shallow semiconductor layer 24 is formed by epitaxial growth on the entire top surface of the substrate 21 throughout the regions A and B. The semiconductor layer 24 serves as a high-resistance layer.

A shallow N− type semiconductor layer 25 called a "reduced surface field layer," or the "RESURF layer" for short, is formed under the high-resistance layer 24 in the substrate 21 so as to surround the N+ type diffusion layer 22. An N+ type semiconductor layer 26 is formed in the high-resistance layer 24, as a low-resistance layer, so as to correspond to the planar shape of the N+ type region of the diffusion layer 22. The low-resistance layer 26 is larger in depth than the high-resistance layer 24; therefore, the low-resistance layer 26 penetrates the high-resistance layer 24 and is electrically connected to the underlying layer 22, whereby the potential of the diffusion layer 22 is "exposed" on the top surface of the substrate 21.

With such an epitaxial wafer 20, both the first region A and the second region B can have "N−/P−" structures. This enables a plurality of elements to be successfully formed in each of the first and second regions A and B in accordance with a normal PN junction-separation technique.

According to this embodiment, individual ones of the elements that are integrated on the wafer can be successfully separated by PN junction-separation from the other elements. In addition, a "double PN junction-separation" structure is obtained in which circuit regions each having plural types of elements are separated from each other by PN junction separation. Since such a wafer structure allows each circuit region to be freely set in a desired different potential independently of the remaining regions, the wafer structure is especially suitable for integration of high-voltage transistors and their peripheral circuits.

Figure 2A:
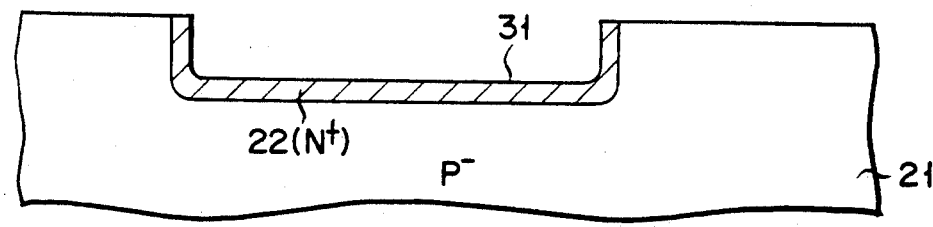
FIGS. 2A to 2D are diagrams schematically showing sectional structures obtained in main steps of a manufacturing process for the wafer in FIG. 1.

A method of manufacturing the epitaxial semiconductor wafer 20 will be described below with reference to FIGS. 2A through 2D. A P− type silicon substrate 11 is prepared. A groove 31 having a preselected depth is formed in the first region of the substrate 21 using a silicon etching technology, such as a reactive ion etching method. An N+ type diffusion layer 22 of high-impurity concentration is formed in the inner surface of the groove 31, as shown in FIG. 2A.

Figure 2B:
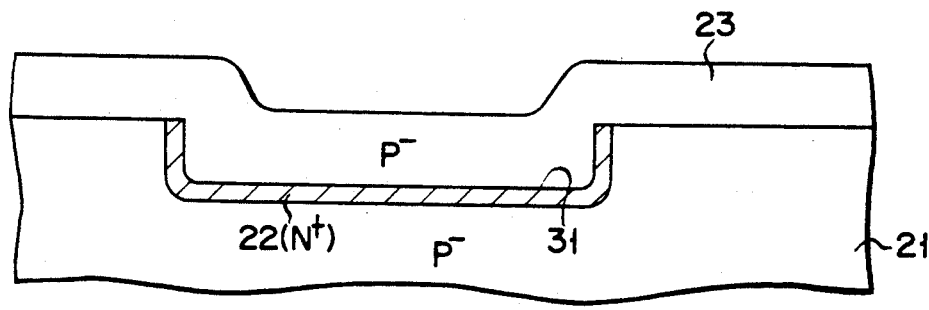
Figure 2C:
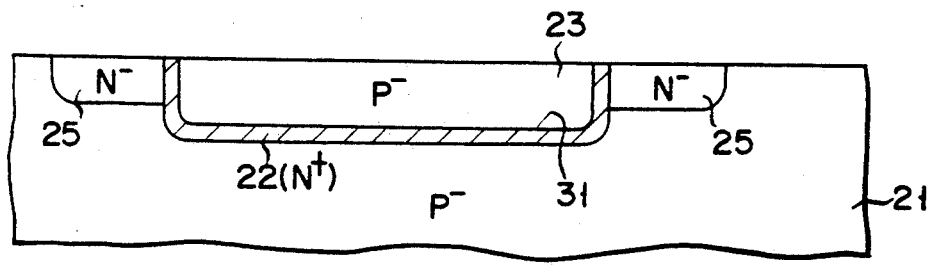

Subsequently, as shown in FIG. 2B, a P− type epitaxial-growth layer 23 is formed on the overall top surface of the resultant layer structure. The wafer surface is then subjected to a lapping treatment so that the wafer surface is flattened to leave the P− type epitaxial-growth layer 23 in only the groove 31 as shown in FIG. 2C. An N− type layer 25 serving as a RESURF layer is formed on the flat top surface section of the substrate 21.

Figure 2D:
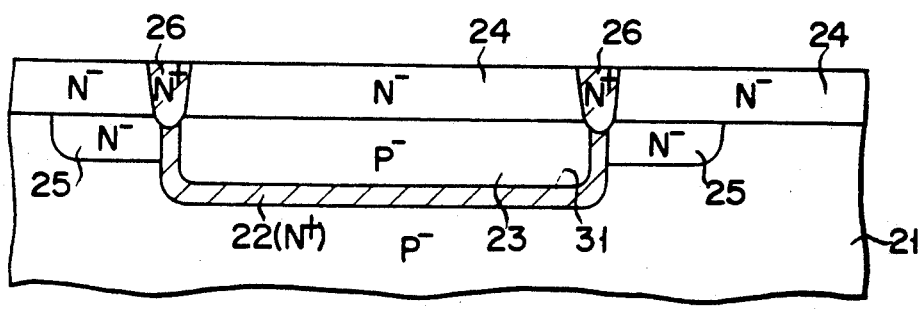

Thereafter, as shown in FIG. 2D, an N− type epitaxial-growth layer 24 is formed on the resultant wafer substrate 21. Finally, an N+ type diffusion layer 26 is formed.

Figure 3:
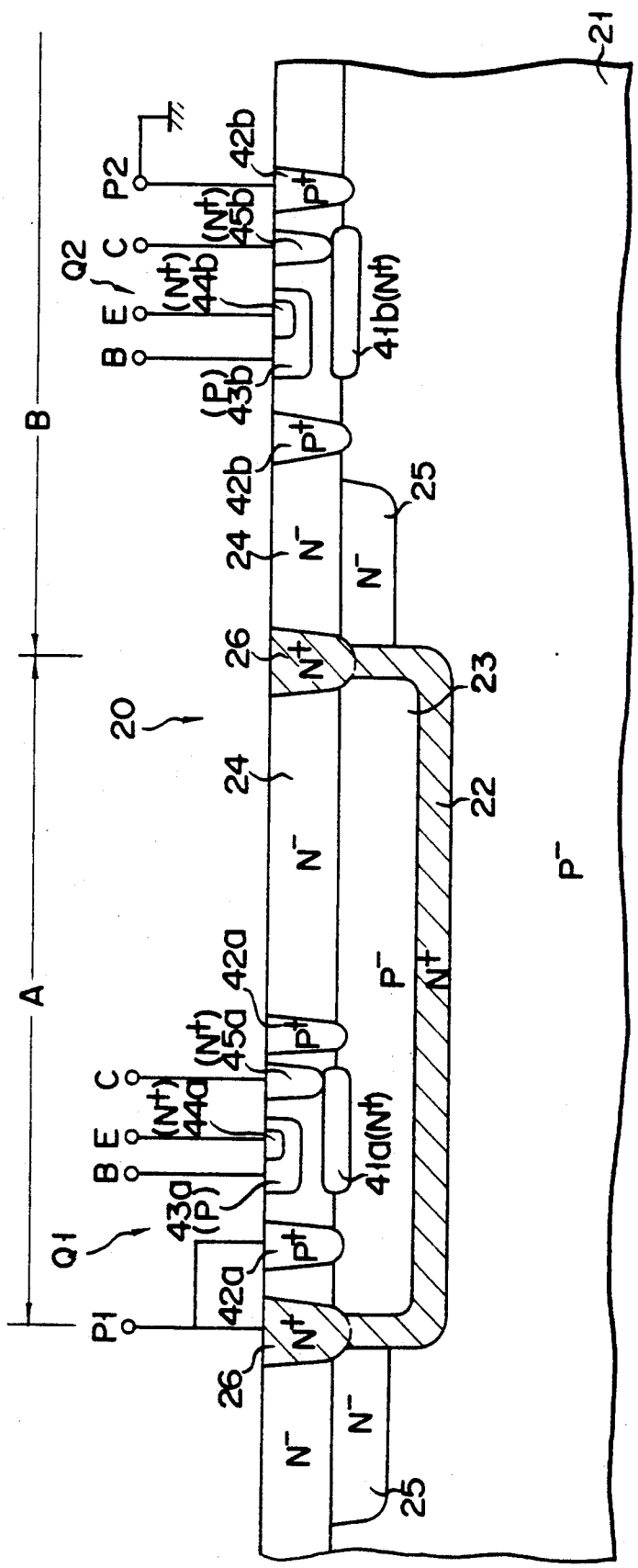
FIG. 3 is a diagram schematically showing a sectional structure in a main part of a device obtained by integrally forming transistors in element-formation regions of the wafer in FIG. 1.

FIG. 3 shows an IC structure which is obtained by integrally forming a plurality transistors in first and second regions A and B of the above-mentioned epitaxial semiconductor wafer 20. In FIG. 3, of the transistors formed in each of the regions A and B, only one transistor Q1 is visible in the region A, while only one transistor Q2 is visible in the region B.

As shown in FIG. 3, collector buried layers 41a and 41b, which are omitted in the previous wafer structure shown in FIG. 1, are respectively formed in the element-formation regions A and B, before the formation of an epitaxial layer 24. Each element-formation region is PN junction-separated, i.e., electrically separated by PN junction, from the remaining part of the wafer structure by P+ type layer 42a or 42b. In the region A, a base layer 43a, an N+ type emitter layer 44a, an N+ type collector layer 44a, and an N+ type collector voltage take-out layer 45a are formed, thereby constituting the transistor Q1. In the other region B, a base layer 43b, an N+ type emitter layer 44b, an N+ type collector layer 44b, and an N+ type collector voltage take-out layer 45b are formed so as to constitute the transistor Q2.

Figure 4:
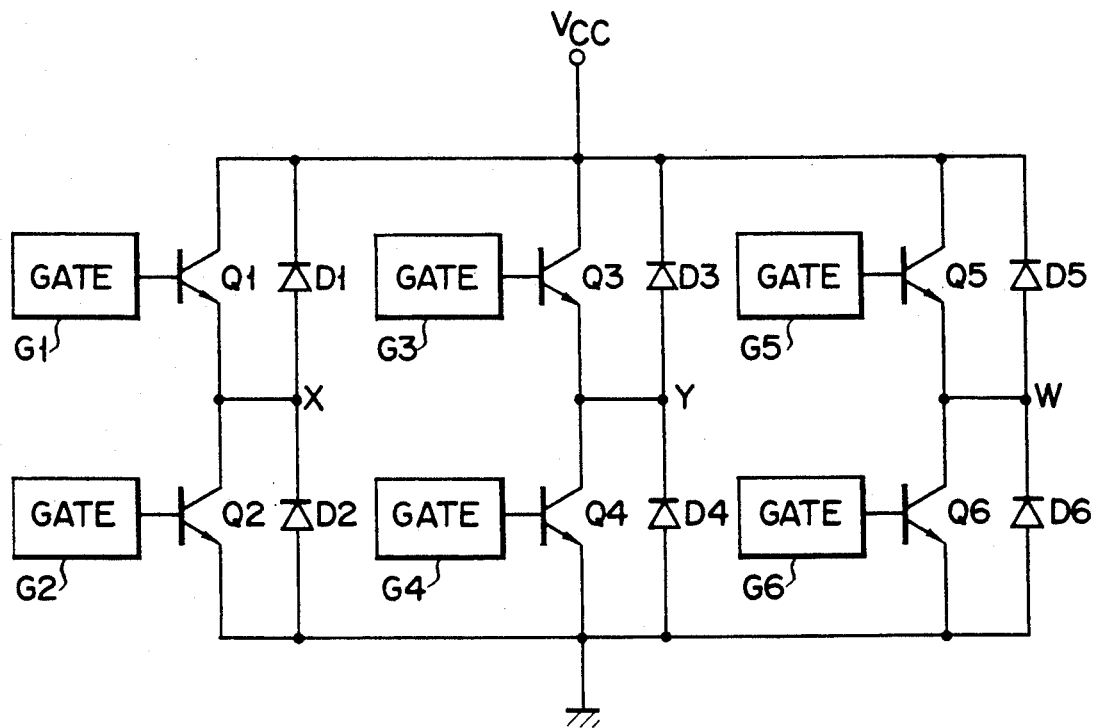
FIG. 4 is a diagram showing an electrically equivalent circuit of the device in FIG. 3.

Transistor circuits in the first and second regions A and B constitute gate circuits G1 and G2, respectively in an equivalent circuit diagram shown in FIG. 4. Therefore, a terminal P1, which connects in common the P+ type separation layer 42a in the first region A to the N+ type layers 22 and 26 for separating the layer A from the layer B, acts as a reference voltage terminal the voltage potential of which changes within a range defined between 0 volts and a power source voltage Vcc. A terminal P2 that is connected to the P+ type separation layer 42b in the second region B functions as a fixed ground potential terminal.

The N− type RESURF layer 25 has a dose of about $5 \times 10^{11}/cm^2$ to $3 \times 10^{12}/cm^2$. The value of specific resistance of the N− type epitaxial layer 24 serving as an element-formation region is determined based on the characteristics of the transistors Q1 and Q2; it may range from 1 to 20 ohm-cm.

With the aforementioned "double PN junction separation" structure, a total voltage potential of the gate circuit formed in the first region A can be successfully varied within the range from the ground potential (=0 volts) to the power source voltage Vcc, independently of the gate circuit formed in the second region B. This enables the gate circuits G1 and G2 for controlling and driving a transistor circuit module in FIG. 4 to be formed on a "single chip" independently of other circuits. Furthermore, it becomes possible, by properly arranging the impurity dose of the N− type RESURF layer 25, to effectively hold the first region A at a high potential.

Figure 5:
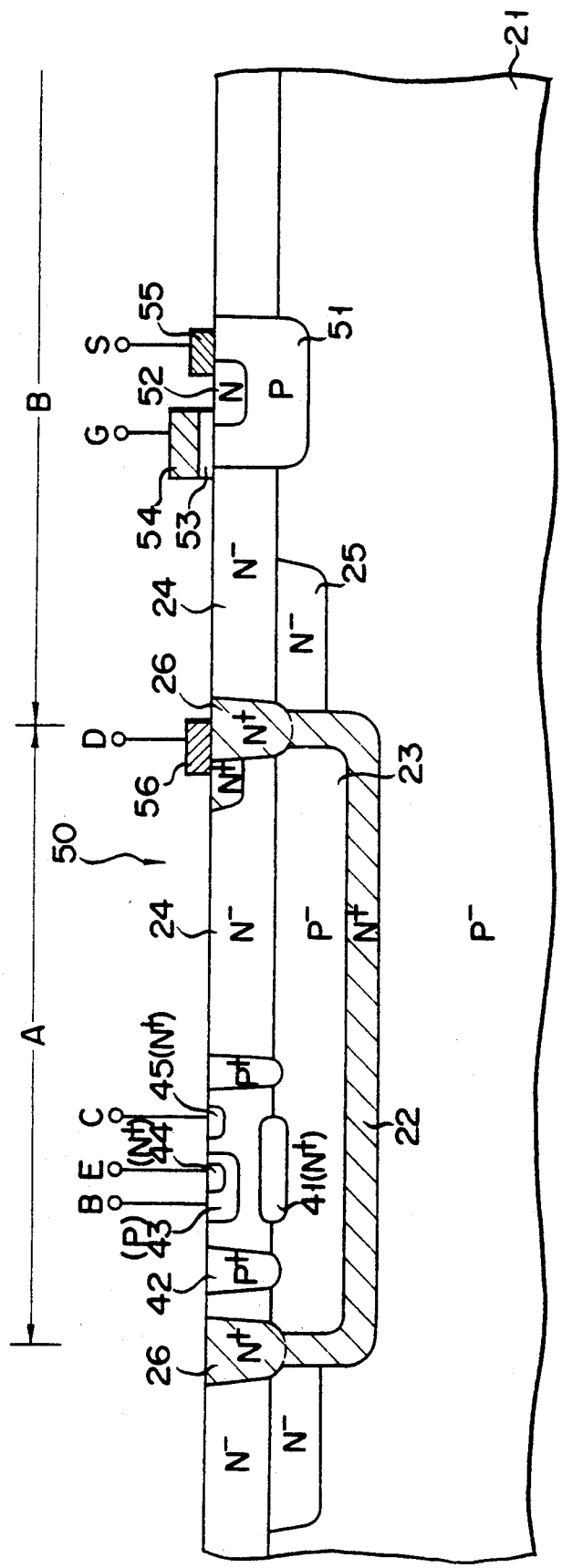
FIG. 5 is a diagram schematically showing a sectional structure in a main part of an epitaxial semiconductor wafer according to the second embodiment of the present invention.

A semiconductor device in accordance with the second embodiment of the present invention is generally designated by reference numeral "50" in FIG. 5. In this embodiment, a high-voltage MOSFET and its control gate circuitry are integrally formed together using the epitaxial semiconductor wafer in FIG. 1.

As in the embodiment in FIG. 3, for example, a gate circuit is formed in a first region A using a plurality of transistors separated from each other by PN junction separation. A high-voltage MOSFET is formed in a second region B. The high-voltage MOSFET is formed of a P type base layer 51 serving as a channel layer, an N type source layer 52 formed in the layer 51, a gate electrode layer 54 insulatively disposed above the P type base layer 51 by a gate insulating layer 53, a conductive source electrode layer 55 electrically contacting the source layer 52 and the P type base layer 51, and a conductive drain electrode layer 56 electrically contacting an N+ type diffusion layer 26.

In this embodiment, when the voltage potential of the drain electrode 56 is varied in response to a turn-ON/OFF operation of the MOSFET, a gate circuit formed in the first region A is entirely changed without any influence to the circuitry in the second region B and can perform a desired circuit operation. Note that the device of this embodiment may also be fabricated using the manufacturing process described with reference to FIGS. 2A through 2D.

Figure 6:
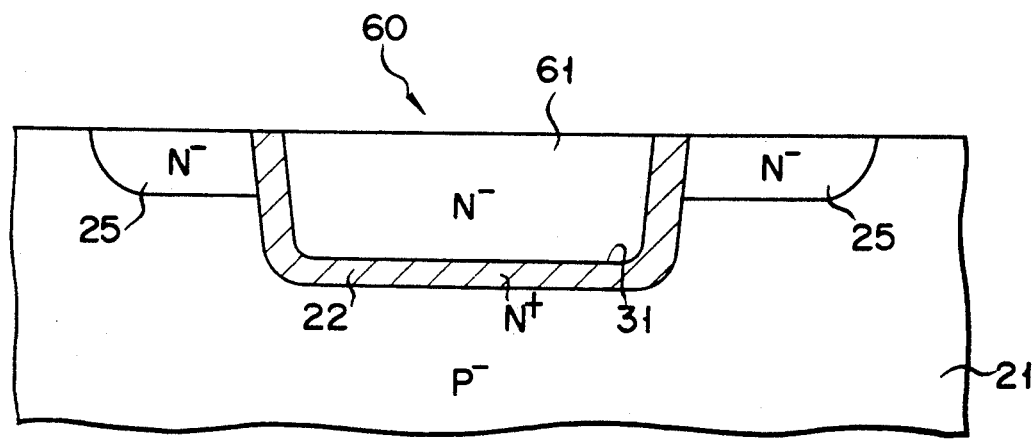
FIG. 6 is a diagram schematically showing a sectional structure in a main part of an epitaxial semiconductor wafer according to the third embodiment of the present invention.

A semiconductor device 60 in accordance with the third embodiment of the present invention is shown in FIG. 6. This embodiment can be considered as an application of the second embodiment. Using the manufacturing process shown in FIGS. 2A through 2D, a groove 23 is formed in a P− type silicon substrate 21. An N+ type diffusion layer 22 is formed on the inside surface of the groove 23. This groove 23 will be an element-formation region. By applying an epitaxial growth method and a lapping technique, an N− type semiconductor layer 61 is deposited in the groove 23. An N− type RESURF layer 25 is then formed around this element region in the same manner as in the above-mentioned embodiments. With the wafer, a high-voltage semiconductor element or elements, such as high-voltage MOSFET(s) and/or bipolar transistor(s) can be effectively formed in the N− type layer 61.

Figure 7:
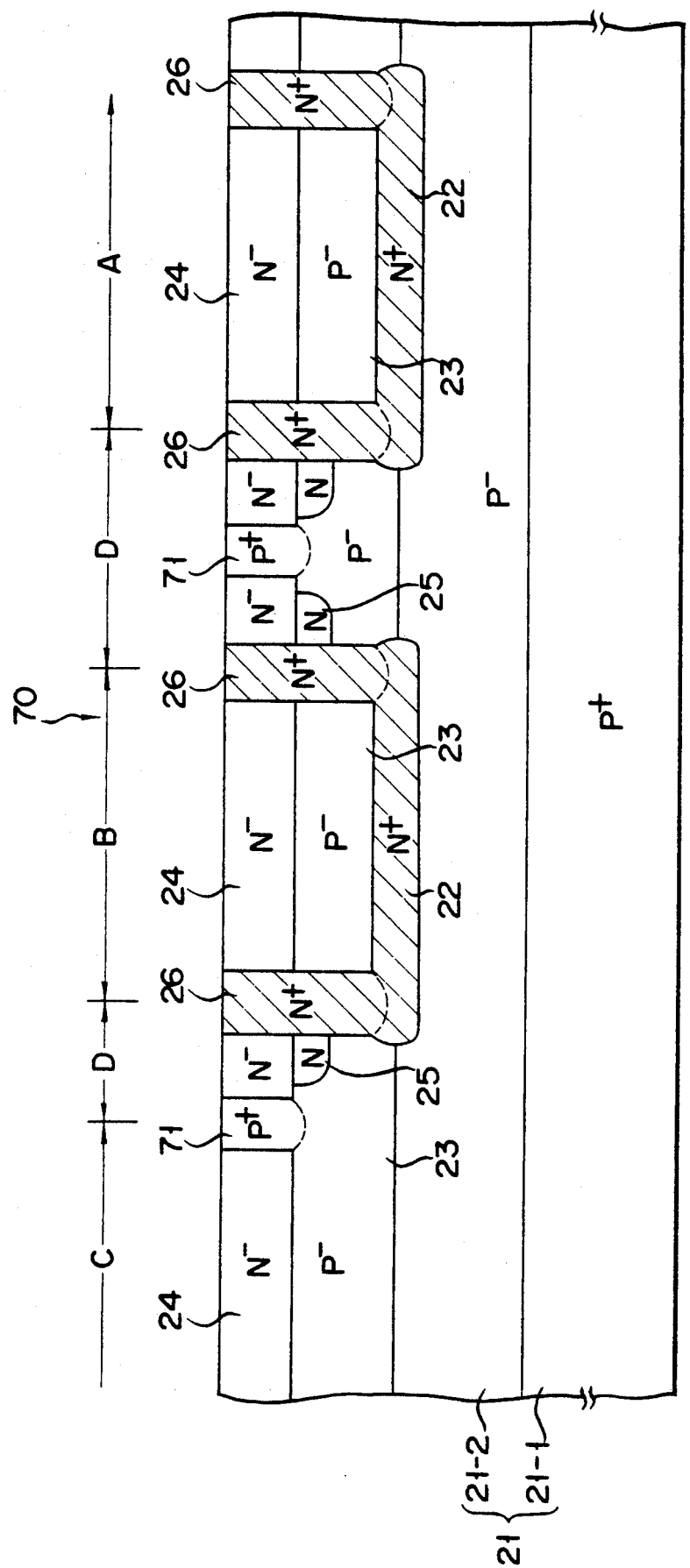
FIG. 7 is a diagram schematically showing a sectional structure in a main part of an epitaxial semiconductor wafer according to the fourth embodiment of the present invention.

Turning to FIG. 7, an epitaxial semiconductor wafer according to the fourth embodiment of the present invention is generally designated by reference numeral "70." A P+ type silicon substrate 21-1 is prepared on which an P type silicon layer 21-2 is stacked, thereby to constitute an P type silicon substrate 21. A P-type epitaxial layer 23 is formed on the silicon substrate 21. An N− type epitaxial layer 24 prospectively serving as an element-formation layer is formed on the P− type epitaxial layer 23.

In FIG. 7, the substrate surface is divided into three regions A, B, and C, each of which is an element-formation region in which one or a plurality of elements should be formed. Separating regions D are formed between the element-formation regions A, B, and C. N− type epitaxial layers 24 laid in the element-formation regions A, B, and C are electrically separated from each other using P+ type diffusing layers 71 by PN junction-separation. These P+ type diffusing layers 71 are formed to have a sufficient depth from the top surface of the wafer to reach the underlying P− type epitaxial layer 23 in the separation regions D.

Of the element-formation regions, in the first regions A and B, unlike in the second region C, an N+ type semiconductor layer 22 is formed as a first element separation layer and is buried between the P− type epitaxial layer 23 and the substrate 21. N+ type diffusing layers 26 each having a depth from the wafer surface to reach the corresponding N+ type layers 22 are formed around the first regions A and B. The N+ type diffusion layer 26 serve as second element separation layers. An N type layer 25 shown in FIG. 7 is formed outside each of the N+ type layers 26. In the epitaxial wafer 70 of this embodiment, as in the above-mentioned embodiments, each of the element regions A, B, and C has the "N−/P−" type junction separation structure.

A method of manufacturing the epitaxial wafer 70 will be described hereinafter with reference to FIGS. 8A through 8E, wherein the regions B, C, and D in FIG. 7 are illustrated.

As shown in FIG. 8A, an N+ type layer 22 having a selected high impurity concentration is formed by diffusion on the top surface of a silicon substrate 21 having a stacked structure consisting of layers 21-1 and 21-2. As shown in FIG. 8B, a P− type epitaxial layer 23 is formed on the entire surface of the substrate 21.

Figure 8C:
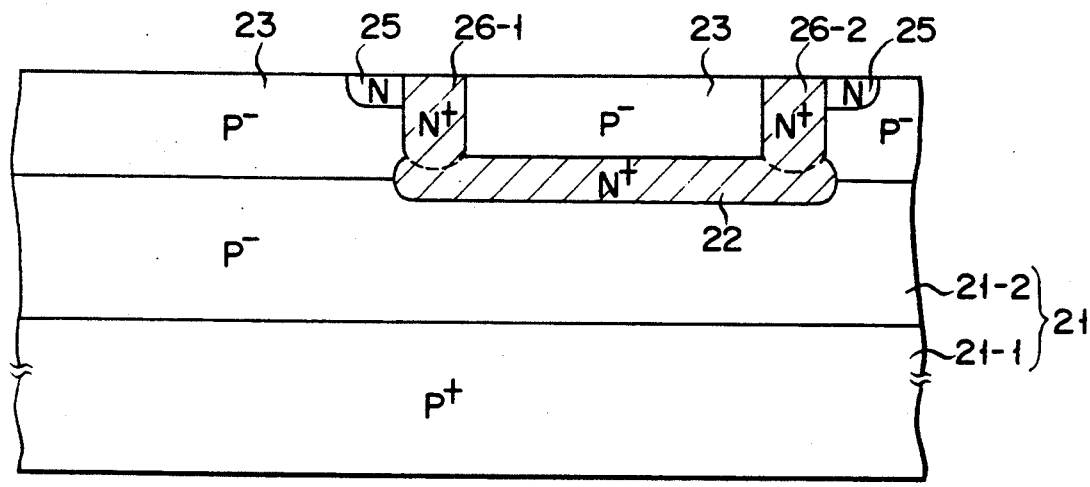

Thereafter, as shown in FIG. 8C, an N type RESURF layer 25 is formed by ion implantation on the substrate 11 around an element-formation region in which the N+ type layer 22 is formed, and an N+ type layer 26-1 for surrounding the element region together with the N+ type layer 22 is formed. The N+ type layer 26 is formed to have a depth to reach the N+ type layer 22, thereby defining a layer portion 23 separated by PN junction-separation.

Figure 8D:
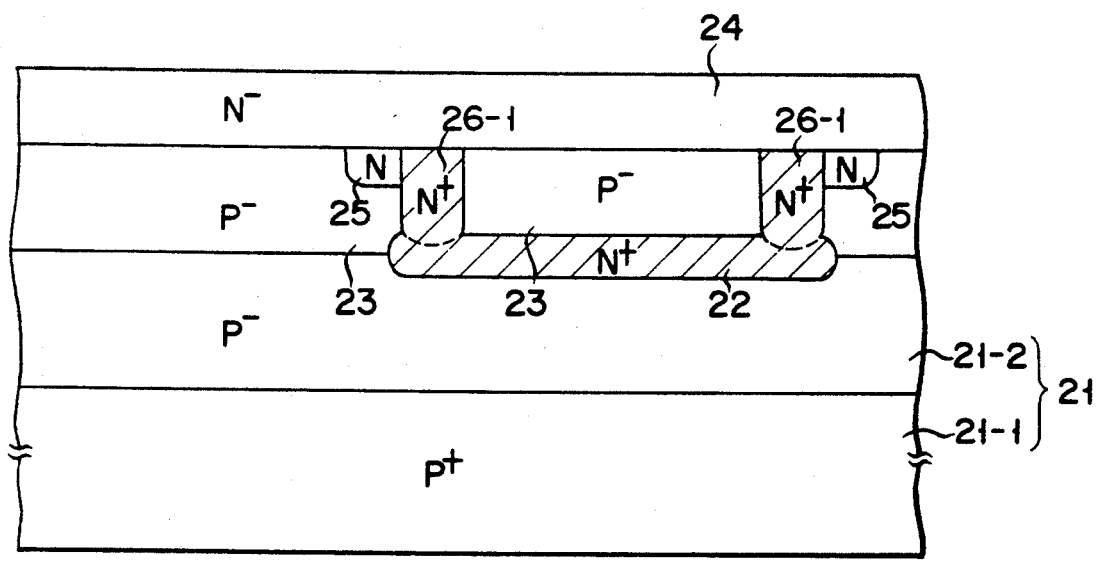
Figure 8E:
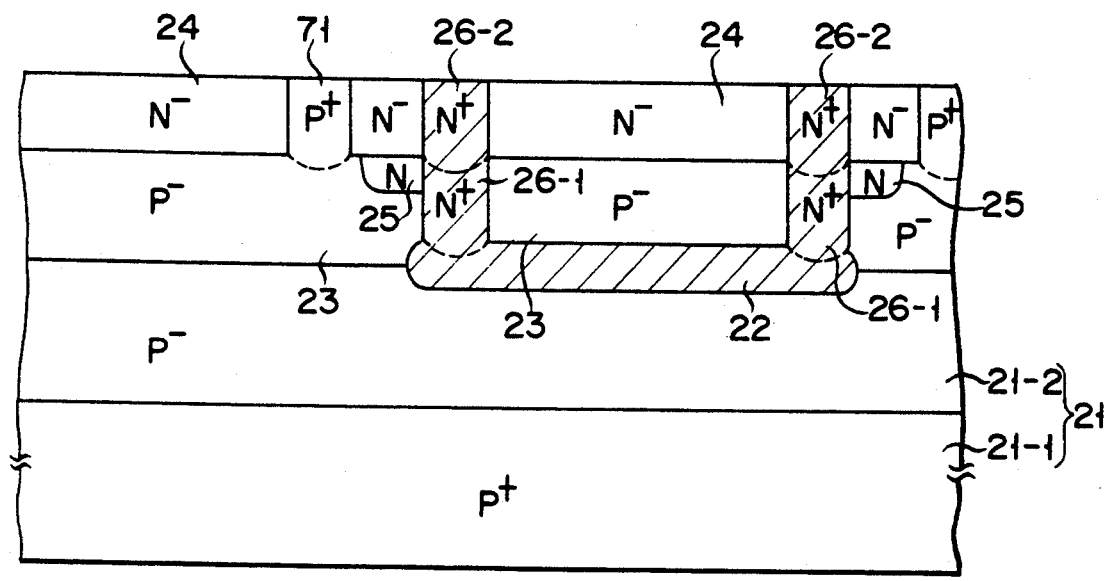

Subsequently, as shown in FIG. 8D, an N− type epitaxial layer 24 is grown to cover the entire top surface of the resultant wafer. In the step shown in FIG. 8E, a further N+ type layer 26-2 is formed by diffusion to just overlap the N+ type layer 26-1, thereby defining the N− type layer section 24 inside the N+ type layer 26-2. In addition, in order to separate each element-formation region by PN junction-separation, a P+ type layer 71 is formed by diffusion to form each separation region between these element-formation regions. The P+ type layer 71 is formed to have a depth to reach and contact the underlying P− type layer 23.

Attention should be paid to the following point: according to the manufacturing process shown in FIGS. 8A through 8E, the stacked N+ type diffusing layers 26-1 and 26-2 serving as element-separation layers together with the n+-type buried layers 22 in the element-formation regions A and B are respectively formed in two diffusion steps, but these N+ type layers 26-1 and 26-2 can be modified to be formed together in only one diffusion step in the process.

Figure 9A:
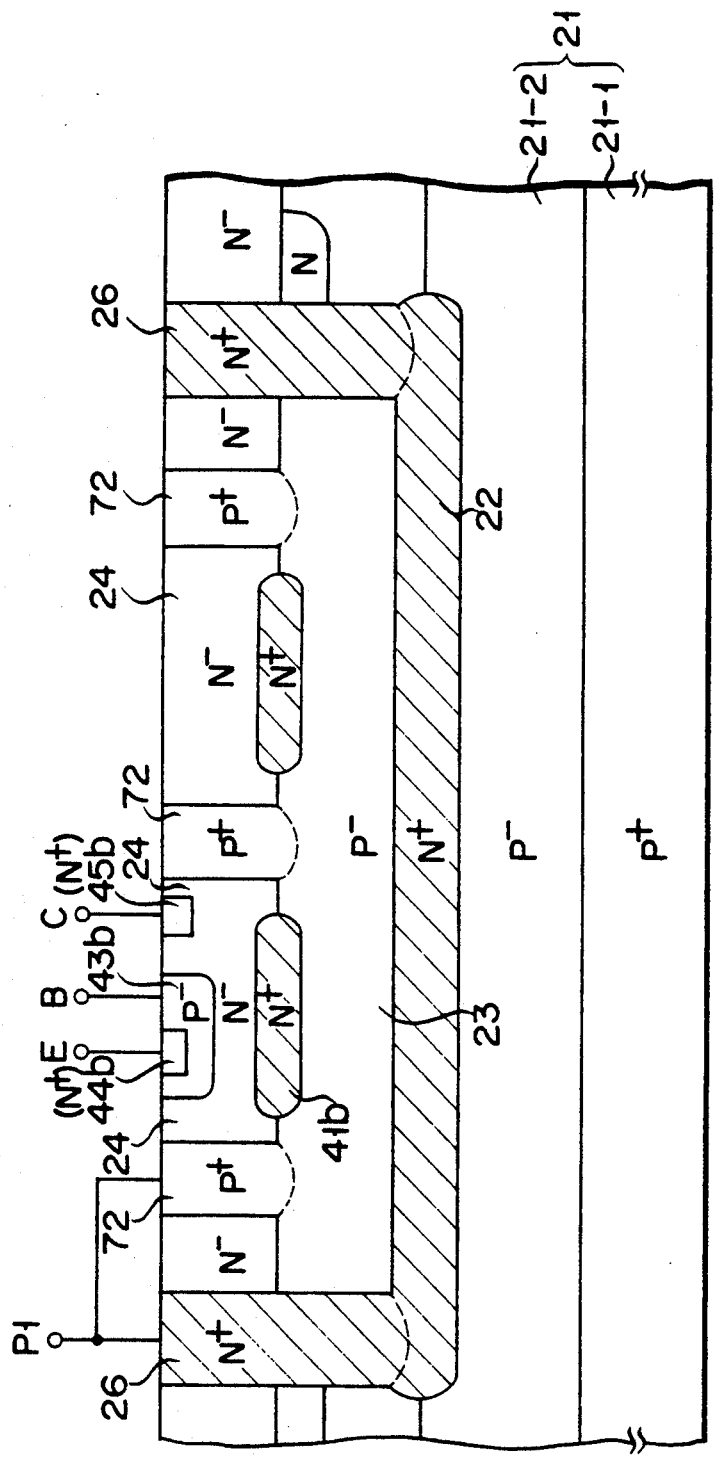

FIGS. 9A and 9B show the main sectional structures of samples of IC devices obtained by integrally forming a plurality of transistors in element-formation regions of the epitaxial wafer 70 in FIG. 7. In FIGS. 9A and 9B, two of the plurality of element-formation regions of the epitaxial wafer 70 are shown: FIG. 9A shows a first region B surrounded by an N+ type layer 26; whereas FIG. 9B shows a second region C located outside the first region B. One transistor is typically formed in each of the illustrated regions.

An N+ type collector buried layer 41 is formed in each of the regions B and C before an N− type epitaxial layer 24 is formed. (The N+ type collector buried layer 41 is omitted in the embodiment in FIG. 7.) In order to separate elements from each other in the regions, a P+ type layer 71 is formed in the second region C simultaneously with formation of a P+ type layer 71 for PN junction-separation from the first region B, and a P+ type layer 72 for separating elements from each other is formed in the first region B. A P type base layer 43, an N type emitter layer 44, and a collector take-out layer 45 are formed in a region surrounded by these layers 71 and 72, as shown in FIG. 9A or 9B. It is to be noted that, in these components, suffix "b" (letter "b" comes from region B) is conveniently added in FIG. 9A, while a suffix "c" (letter "c" comes from region C) is added in FIG. 9B for illustrative convenience only.

The transistor circuit in the first region B constitutes a gate circuit G1 shown in FIG. 4, for example; the transistor circuit in the second region C constitutes a gate circuit G2 shown in FIG. 4, for instance. In such a case, in the transistor circuit in FIG. 9A in the first region B, a terminal P1 for commonly connecting the N+ type layer 26 and the P+ type layer 71 serving as a separation layer for an inner region surrounded by the N+ type layer 26 is used as a reference voltage terminal having a voltage which changes within the range from 0 volts to the power source voltage Vcc. On the other hand, in the transistor circuit in the second region C shown in FIG. 9B, a terminal P2 connected to the P+ type separation layer 71 is used as a ground terminal to which a fixed ground potential is applied.

In FIGS. 9A and 9B, the case wherein NPN transistors are integrally formed has been described above. However, the elements to be formed on the substrate may include other types of elements consisting of gate circuits such as CMOS transistors, diodes, resistors, capacitors, and so forth. When the concentration of an N− type epitaxial layer 14 is set to be a proper value, an N type layer 25 serving as a RESURF layer may be omitted.

Figure 10:
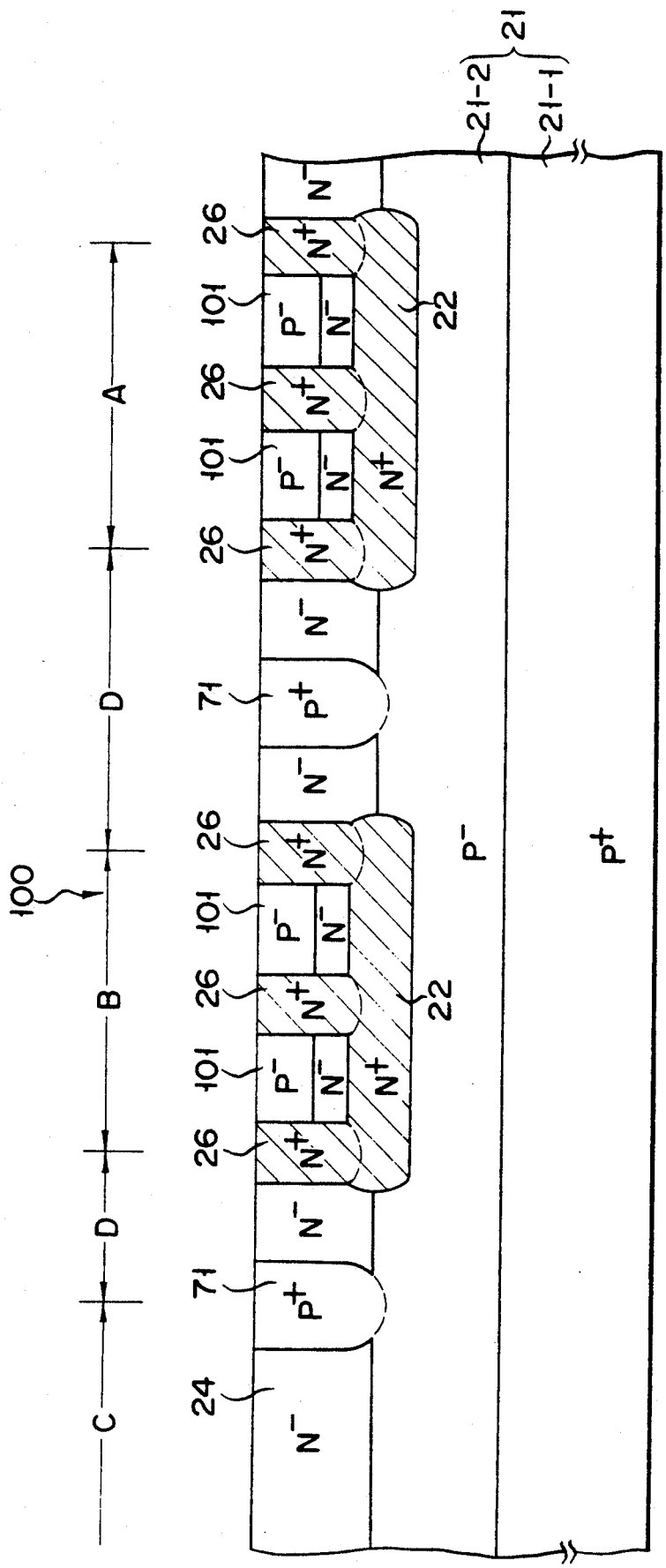
FIG. 10 is a diagram schematically showing a sectional structure in a main part of an epitaxial semiconductor wafer according to the fifth embodiment of the present invention.

In FIG. 10, an epitaxial semiconductor wafer in accordance with the fifth embodiment of the present invention is generally designated by reference numeral "100". The wafer 100 differs from the above embodiment shown in FIG. 7 in that an N− type epitaxial layer 24 is directly formed on a P− type silicon substrate 21 without forming a P type epitaxial layer. As in the embodiment in FIG. 7, a P+ type layer 71 is formed in separation regions D for separating element-formation regions A, B, C, . . . from each other.

In the first region A or B surrounded by N+ type layers 22 and 26, a P− type diffusion layer 101 is formed as an element-formation layer. In the second region C located outside these regions, an N− type layer 24 functions as an element-formation layer. The P− type layer 101 in the first region A or B is subdivided into a plurality of element-formation sub regions by the N+ type layer 26.

More specifically, in the embodiment in FIG. 7, all the elements formation layers are N− type layers, and element separation is performed by P+ type layers. In contrast to this, in the embodiment in FIG. 10, elements formation layers include N− and P− types layers of both conductivity types. Therefore, as detailed IC structures will be described later, element separation is performed by a P+ type layer in the N− type layer region; whereas, in the P− type layer region, the element separation is performed by an N+ type.

A method of manufacturing the epitaxial semiconductor wafer 100 will be described below with reference to FIGS. 11A through 11D. These views of manufacturing steps show a range of the regions B, C, and D.

As shown in FIG. 11A, an N+ type layer 22 serving as an element-separation layer is formed by diffusion on a P− type silicon substrate 21. At this time, the N+ type layer 22 is formed in the region C as needed.

As shown in FIG. 11B, an N− type epitaxial layer 24 is then formed on the entire top surface of the resultant substrate. Thereafter, P+ type layers 71 for separating element-formation regions from each other are formed by diffusion to have a depth to reach a substrate 21. The element-formation regions A and B are separated from other regions. An N+ type layer 26 is formed on the element-formation regions A and B to have a depth to reach the N+ type layer 22, thereby defining a plurality of element regions therein, as shown in FIG. 11C. Subsequently, as shown in FIG. 11D, P− type layers 101 serving as element-formation regions are formed by diffusion in the regions A and B.

Figure 12:
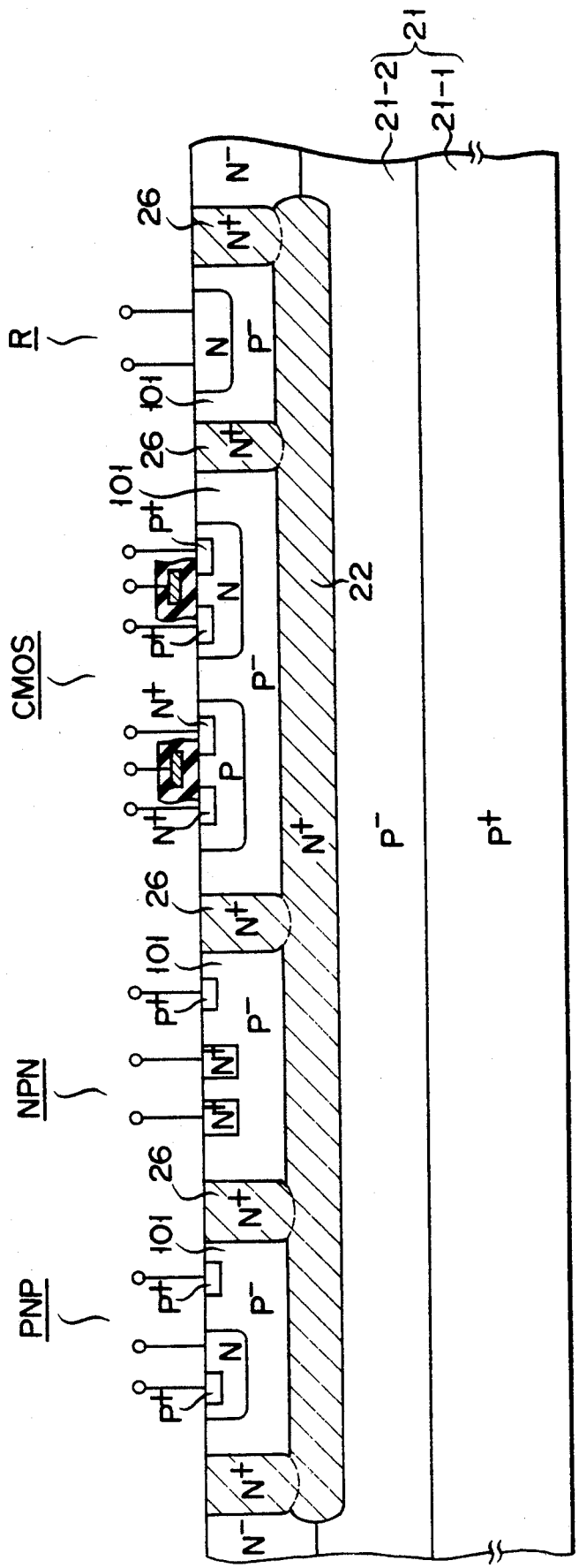
FIG. 12 is a diagram showing a sectional structure of a sample of an IC structure to which the wafer in FIG. 10 is employed.

Samples of IC structures to which the epitaxial wafer 100 of this embodiment is applied are shown in FIGS. 12 and 13. FIG. 12 shows a partial wafer structure according to the first region A (or B), whereas FIG. 13 shows a partial wafer structure according to the second region C.

As shown in FIG. 12, a plurality of element-formation regions formed in the first region A are separated by the N+ type layers 26 from each other. In these separated regions, NPN transistors, PNP transistors, CMOS transistor circuits, and resistances are integrally formed. In FIG. 12, reference letters "PNP", "NPN", "CMOS", and "R" are respectively added to these components for the sake of easy identification. In the IC structure, unlike the embodiment in FIG. 10, the P− type layer 101 serving as an element-formation layer is formed to have a depth to reach the underlying N+ type layer 22. The resistor R is constituted by an N− type layer formed by diffusion on the P− type layer 101. The CMOS circuit is constituted by forming a P− channel MOSFET and an N-channel MOSFET in an N type well region and a P type well region formed in the P− type layer 101. An NPN transistor is a lateral transistor obtained by forming an emitter and a collector by diffusion and using the P− type layer 101 as a base of the NPN transistor. A PNP transistor is constituted by defining a conventional planar structure using the P-type layer 101 as a collector layer of the PNP transistor.

A plurality of element regions in the second region C are separated from each other by P+ type layers 71 as shown in FIG. 13. As in the above embodiment in FIG. 12, an NPN transistor, a PNP transistor, a CMOS transistor circuit, and a resistor R are integrally formed in each of the separated regions. The conductivity type of elements formation layers in the second region C is opposite to that in the first region A in the region C. With the above description, the resistor R in FIG. 13 is formed by a P type diffusion layer. The CMOS circuit is formed in the N type well region and the P type well region, as in the region A. Structures of the PNP transistor and the NPN transistor in the region C are opposite to those in the above region A; the PNP transistor has a lateral structure, and the NPN transistor has a planar structure.

A transistor circuit formed in the region A of each of the wafers shown in FIG. 12 and 13 is a gate circuit on a high voltage side, as in the previously presented embodiments; and a transistor formed in the region C is used as a gate circuit on a low voltage side. The N+ type layer 26 in FIG. 12 is set to be the maximum voltage potential, and the N+ type layer 71 is set to be the minimum voltage potential, i.e., a normal ground potential (= typically 0 volts). With the above potential setting, PN junction separation between the high and low voltage sides of this circuitry can be further confirmed. By employing the "double PN junction separation", as in the above-mentioned embodiments, the reference voltage of the transistor circuit in the region A in FIG. 12 can be desirably changed within the range between the ground potential (0 volts) and the power source voltage Vcc, independently of the reference voltage of the transistor circuit in the region C in FIG. 12. Using the IC structure, gate circuits G1 to G6 for driving/controlling the transistor circuit module shown in FIG. 4 can be effectively packaged in one chip.

It should be noted that in FIG. 12 the P− type layer 101 is not always absolutely required, and, for example, the P− type layer 101 need not be formed in a region for forming a resistor. Similarly, in the wafer structure in FIG. 13, N+ type buried layers 22 in a PNP transistor-formation region or a CMOS circuit-formation region can be omitted depending on conditions.

What is claimed is:
1. A semiconductor device comprising:
   a wafer layer of a first conductivity type;
   a heavily-doped semiconductive separation layer of a second conductivity type formed on said wafer layer to define a first closed region and a second region adjacent to the first region;
   a PN junction structure provided in said first region and having a semiconductive layer of the first conductivity type and a lightly-doped semiconductive layer of the second conductivity type stacked on said semiconductive layer of the first conductivity type and serving as a first element-formation layer;
   a lightly-doped semiconductive layer of the second conductivity type formed on said wafer layer in the second region and serving as a second element-formation layer; and
   a semiconductor element formed in said first element-formation layer to be PN junction-separated, thereby to provide a double PN junction separation structure in which said first region is separated by PN junction from said second region and said semiconductor element is PN-junction separated in said first region.

2. The device according to claim 1, wherein said first element-formation layer is substantially equal in thickness to said second element-formation layer.

3. The device according to claim 2, further comprising:
   a lightly-doped semiconductive layer formed on said wafer layer to surround said heavily-doped semiconductive separation layer and serving as a reduced surface field layer layer called a RESURF layer.

4. The device according to claim 2, wherein said semiconductor element includes a high-voltage transistor.

5. The device according to claim 4, further comprising:
   a second semiconductor element formed in said second element-formation layer, said second semiconductor element including a high-voltage transistor.

6. The device according to claim 2, wherein the stacked layers of said PN junction structure include an epitaxial layer.

7. The device according to claim 2, wherein the stacked layers of said PN junction structure are epitaxial layers.

8. The device according to claim 2, wherein the stacked layers of said PN junction structure include a diffusion layer.

* * * * *